(12) United States Patent
Nakazawa

(10) Patent No.: US 8,056,198 B2
(45) Date of Patent: Nov. 15, 2011

(54) METHOD OF MANUFACTURING ELECTRONIC DEVICE

(75) Inventor: Toshio Nakazawa, Yohkaichi (JP)

(73) Assignee: Kyocera Corporation, Kyoto (JP)

( * ) Notice: Subject to any disclaimer, the term of this patent is extended or adjusted under 35 U.S.C. 154(b) by 855 days.

(21) Appl. No.: 11/069,766

(22) Filed: Feb. 28, 2005

(65) Prior Publication Data

US 2005/0193548 A1 Sep. 8, 2005

(30) Foreign Application Priority Data

Feb. 26, 2004 (JP) ................................ 2004-052154
Feb. 26, 2004 (JP) ................................ 2004-052155
Feb. 26, 2004 (JP) ................................ 2004-052157
Apr. 1, 2004 (JP) ................................ 2004-108878

(51) Int. Cl.
*H04R 17/10* (2006.01)

(52) U.S. Cl. ........... 29/25.35; 29/830; 29/417; 310/311; 310/348

(58) Field of Classification Search ................. 29/25.35, 29/584, 830, 417, 414–416, 854; 310/310, 310/348, 313 B, 311
See application file for complete search history.

(56) References Cited

U.S. PATENT DOCUMENTS

| | | | | |
|---|---|---|---|---|
| 4,191,905 A | * | 3/1980 | Yasuda et al. | 310/344 |
| 4,744,009 A | | 5/1988 | Grabbe et al. | |
| 4,747,192 A | * | 5/1988 | Rokurota | 29/25.35 |
| 5,191,796 A | * | 3/1993 | Kishi et al. | 73/632 |
| 5,499,444 A | * | 3/1996 | Doane et al. | 29/830 |
| 5,502,344 A | * | 3/1996 | Yoshimoto et al. | 310/344 |
| 5,506,463 A | * | 4/1996 | Yoshimoto et al. | 310/344 |
| 5,611,129 A | * | 3/1997 | Yoshimoto et al. | 29/25.35 |
| 5,846,852 A | * | 12/1998 | Limper-Brenner et al. | 438/118 |
| 6,388,545 B1 | * | 5/2002 | Kawachi et al. | 210/313 B X |
| 6,670,206 B2 | * | 12/2003 | Kim et al. | 438/26 |
| 6,751,832 B2 | * | 6/2004 | Hirota et al. | 29/25.35 |
| 6,784,542 B2 | * | 8/2004 | Fukasawa et al. | 257/730 |
| 7,107,672 B2 | * | 9/2006 | Onitsuka et al. | 29/832 |
| 7,152,290 B2 | * | 12/2006 | Junhua et al. | 29/25.35 |
| 7,248,133 B2 | * | 7/2007 | Koga et al. | 333/193 |
| 2004/0083604 A1 | * | 5/2004 | Liu | 29/830 |
| 2004/0108790 A1 | * | 6/2004 | Junhua et al. | 310/311 |
| 2004/0160750 A1 | * | 8/2004 | Masuko | 361/761 |
| 2005/0055814 A1 | * | 3/2005 | Hatanaka et al. | 29/25.35 |
| 2005/0193548 A1 | * | 9/2005 | Nakazawa | 29/594 |

FOREIGN PATENT DOCUMENTS

| | | |
|---|---|---|
| JP | 2001-274649 | 10/2001 |
| JP | 2002026679 A | 1/2002 |
| JP | 2002100694 A | 4/2002 |
| JP | 2003031526 A | 1/2003 |

OTHER PUBLICATIONS

Japanese language office action and its English language translation for corresponding Japanese application 2004108878.

* cited by examiner

*Primary Examiner* — A. Dexter Tugbang
(74) *Attorney, Agent, or Firm* — DLA Piper LLP (US)

(57) ABSTRACT

A master substrate 15 having a plurality of substrate areas A arranged in a matrix shape is prepared, and a piezoelectric oscillation element 5 is carried in each of the substrate areas A. A main cover 16 made of a metal having a plurality of cover areas B having a one-to-one correspondence with the substrate areas A is placed and joined on the master substrate 15. The main cover 16 is together cut along the outer periphery B' of each of the cover areas B, to simultaneously obtain a plurality of electronic devices. The productivity can be improved by simplifying the assembling steps.

7 Claims, 16 Drawing Sheets

METHOD OF MANUFACTURING ELECTRONIC DEVICE

BACKGROUND OF THE INVENTION

1. Field of the Invention

The present invention relates to a method of manufacturing an electronic device used for electronic and communication equipment such as portable communication equipment and an electronic computer.

2. Description of Related Art

Conventionally, electronic devices containing piezoelectric oscillation elements such as surface acoustic wave elements and crystal oscillation elements (electronic devices with built-in piezoelectric oscillation elements) have been used for electronic and communication equipment such as portable communication equipment and electronic computers.

As such electronic devices, a "crystal oscillator" which is the electronic device containing the crystal oscillation element will be described by way of example.

The conventional crystal oscillator has an insulating base 21 constructed by laminating plate-shaped insulating layers 21a and 21b and a frame-shaped insulating layer 21c, as illustrated in FIG. 23, for example. An area on an upper surface of the plate-shaped insulating layer 21b and surrounded by the frame-shaped insulating layer 21c is provided with a pair of connecting pads 22. A crystal oscillation element 25 having a pair of oscillation electrodes electrically connected through conductive adhesives is attached to the connecting pads 22. A cover 27 made of a metal is joined to the top of the frame-shaped insulating layer 21c through a wax material, thereby air-tightly sealing a space where the crystal oscillation element 25 is carried (see JP2001-274649-A, for example).

Such a crystal oscillator is set into thickness sliding oscillation at a predetermined frequency corresponding to the characteristics of the crystal oscillation element 25 when a varied voltage from the outside is applied between the oscillation electrodes of the crystal oscillation element 25 through an input/output terminal 23 provided on a lower surface of the insulating base 21. A reference signal having a predetermined frequency is oscillated and outputted by an external oscillation circuit on the basis of the resonance frequency. Such a reference signal is utilized as a clock signal in the electronic and communication equipment such as the portable communication equipment, for example.

The insulating base 21 in the above-mentioned crystal oscillator is generally formed by dividing a large-sized master substrate to obtain pieces. The crystal oscillation element 25 is attached to each of the obtained pieces (the insulating base 21), and the cover 27 is joined to the top of the frame-shaped insulating layer 21c, thereby manufacturing the crystal oscillator.

The cover 27 in the above-mentioned crystal oscillator is cut down by dividing a large-sized metal plate (a main cover), similarly to the insulating base 21.

The cover 27 is electrically connected to a ground terminal through the insulating base 21. When the crystal oscillator is used, the cover 27 is held at a ground potential so that noise from the outside is shielded.

The space where the crystal oscillation element 25 is carried may be air-tightly sealed by attaching a seal ring made of a metal so as to surround the crystal oscillation element 25 in place of the frame-shaped insulating layer 21c and joining the cover 27 made of a metal to the top of the seal ring by seam welding or the like.

In the above-mentioned conventional crystal oscillator, however, it is necessary to divide the large-sized master substrate to obtain the individual insulating bases 21 and divide a large-sized main cover to obtain the individual covers 27 prior to the assembling thereof so that the two types of members are respectively obtained by separate dividing steps.

Consequently, the assembling steps of the crystal oscillator become complicated, which does not improve productivity.

When the crystal oscillator is assembled after preparing the individual insulating bases 21 and the individual covers 27 in advance, as described above, each of the plurality of insulating bases 21 must be held in a carrier in order to perform work for the assembling.

Furthermore, the cover 27 is positioned and mounted on the individual insulating base 21 held in the carrier, so that the assembling steps for the crystal oscillator become complicated.

SUMMARY OF THE INVENTION

An object of the present invention is to provide a method of manufacturing an electronic device capable of simplifying the assembling steps to improve productivity.

A method of manufacturing an electronic device according to the present invention comprises step (a) of preparing one master substrate having a plurality of substrate areas arranged in a matrix shape and carrying a piezoelectric oscillation element in each of the substrate areas of the master substrate; step (b) of placing and joining one main cover including the plurality of substrate areas on the master substrate in such a manner that the piezoelectric oscillation element is sealed; and step (c) of together cutting the master substrate and the main cover that are joined to each other along the outer periphery of each of the substrate areas to simultaneously obtain a plurality of electronic devices.

According to the method of manufacturing the electronic device according to the present invention, the plurality of electronic devices can be simultaneously obtained by preparing the master substrate in which the piezoelectric oscillation element is carried on each of the substrate areas and the one main cover including the substrate areas of the master substrate, placing and joining the main cover on the master substrate in such a manner that the piezoelectric oscillation element is sealed, and then together cutting the master substrate and the main cover along the outer periphery of each of the substrate areas. Consequently, the substrate and the cover need not be previously divided into pieces prior to assembling of the electronic device. Therefore, the substrate and the cover can be simultaneously cut by together dividing them.

Moreover, in this case, the master substrate itself can function as a carrier in assembling the electronic device. Therefore, the necessity of complicated work for holding each of the pieces obtained by dividing the master substrate in the carrier or mounting the cover on each of the pieces is fully eliminated.

Consequently, the assembling steps of the electronic device are significantly simplified, thereby making it possible to improve the productivity of the electronic device.

The piezoelectric oscillation element may be a crystal oscillation element, for example.

If holes into which positioning pins are insertable are provided at predetermined positions in portions, other than the substrate areas, of the master substrate and the main cover, the master substrate and the main cover can be accurately positioned simply at the time of placement and joining in the step (b) and at the time of cutting in the step (c).

Even if the master substrate and the main cover are temporarily fixed to each other with a clip, the master substrate and the main cover can be accurately positioned simply, similarly to the positioning pins.

If a groove serving as a guide in cutting the master substrate and the main cover along the outer periphery of the substrate area is formed in the main cover, the master substrate and the main cover can be accurately divided along the outer periphery of the substrate area.

If the main cover has a protruding portion on a back surface thereof where the groove is formed, and the protruding portion is in contact with the master substrate in a state where the main cover is placed and joined on the master substrate, an upper surface of the master substrate supports the lower end surface of the protruding portion in cutting the main cover and the master substrate from the side of the main cover toward the master substrate, thereby making it possible to prevent the main cover and the master substrate from warping. A lower surface, provided with an external terminal, of the master substrate is kept substantially flat, thereby making it possible to obtain an electronic device superior in mounting properties in a case where it is mounted on an external circuit board such as a mother board.

When the master substrate is made of ceramics, and the main cover is made of a metal, and the master substrate and the main cover are cut along the outer periphery of each of the substrate areas, it is also possible to cut the main cover by a first blade along the outer periphery of the substrate area, to form a penetration groove penetrating the main cover in the thickness direction and to insert a second blade narrower than the first blade into the penetration groove to cut and divide the master substrate.

Thus, a composite material constructed by joining two types of members, i.e., the master substrate made of ceramics and the main cover made of a metal can be cut using two types of blades suited to cut their respective materials. Therefore, the creation of stress in the composite material by the cutting can be effectively restrained, as compared with a case where the composite material is cut using one type of blade. Consequently, the operating properties of the electronic device can be stabilized by holding the airtight sealing properties of the piezoelectric oscillation element without stripping the substrate and the cover. When the piezoelectric oscillation element is a crystal oscillation element, for example, the resonance frequency can be kept constant.

A recess serving as a sealed space of the piezoelectric oscillation element in each of the substrate areas may be formed on a main surface of the master substrate, or may be formed in the main cover.

When the recess is formed in the master substrate, a frame serving as a peripheral edge of the recess is formed on the main surface of the master substrate.

The frames may be connected to each other between the adjacent substrate areas. If the master substrate and the main cover are integrally formed in a state where the frames carried on the master substrate are connected to each other, the frames, together with the master substrate and the main cover, are together cut, thereby making it possible to divide the frames into pieces having a one-to-one correspondence with the substrate areas.

In this connecting area, it is preferable that a joining material for joining the main cover to the frame is provided between the adjacent substrate areas separately for the substrate areas. Thus, a joining material for joining both the master substrate and the main cover does not exist in cut portions of the master substrate and the main cover, so that a dicer is barely brought into contact with the joining material in cutting the master substrate and the main cover. Consequently, problems such as a crack can be effectively prevented from occurring in the joining material by contact with the dicer.

The master substrate and the frame may be made of ceramics, and the frame may be a seal ring made of a metal.

When a recess serving as a sealed space of the piezoelectric oscillation element in each of the substrate areas is formed in the main cover, the main cover has cover areas having a one-to-one correspondence with the substrate areas. For each of the cover areas, a recess serving as a sealed space of the piezoelectric oscillation element carried on the corresponding substrate area of the master substrate is formed, so that an abutted leg that is abutted against the outer periphery of each of the substrate areas on the main surface of the master substrate is provided in a lower part of the main cover.

According to the configuration, even if the main cover and the master substrate are cooled to room temperature after heat energy is applied thereto in joining the main cover in the step (b), stress created by the difference in an amount of heat shrinkage between the main cover and the master substrate is satisfactorily absorbed and alleviated by the deformation of the recesses. Consequently, the possibility that the master substrate and the main cover that are integrated with each other greatly warp by the stress is eliminated, and the lower surface, provided with the external terminal, of the master substrate is kept substantially flat, thereby making it possible to obtain an electronic device superior in mounting properties in the case of mounting on an external circuit board such as a mother board.

If a joining material for joining the abutted leg with the main surface of the master substrate is provided between the adjacent substrate areas separately for the substrate areas, no joining material exists in a cut portion of the abutted leg. Therefore, a dicer is barely brought into contact with the joining material in cutting the master substrate and the main cover. Thus, problems such as a crack can be effectively prevented from occurring.

It is preferable that a recessed groove into which the abutted leg is fitted and inserted is provided on the main surface of the master substrate. Thus, alignment of the main cover in placing the main cover on the master substrate becomes easy, and workability in assembling the electronic device becomes good.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
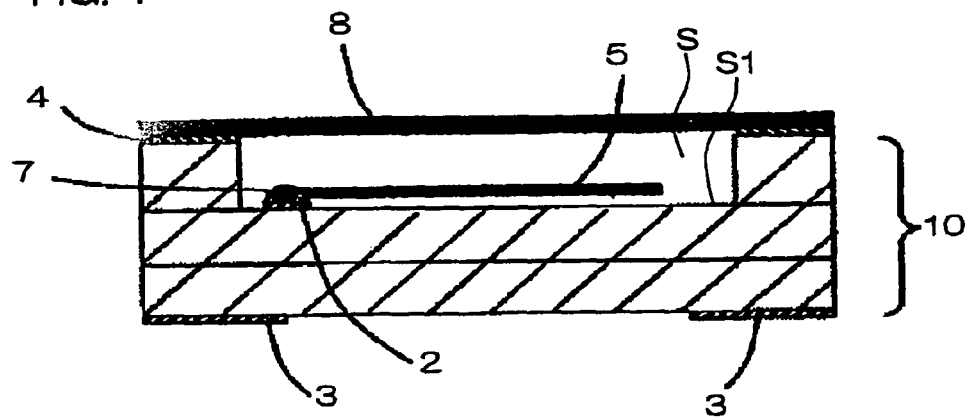
FIG. 1 is a cross-sectional view showing the internal configuration of a crystal oscillator manufactured by a manufacturing method according to the present invention.
Figure 2:
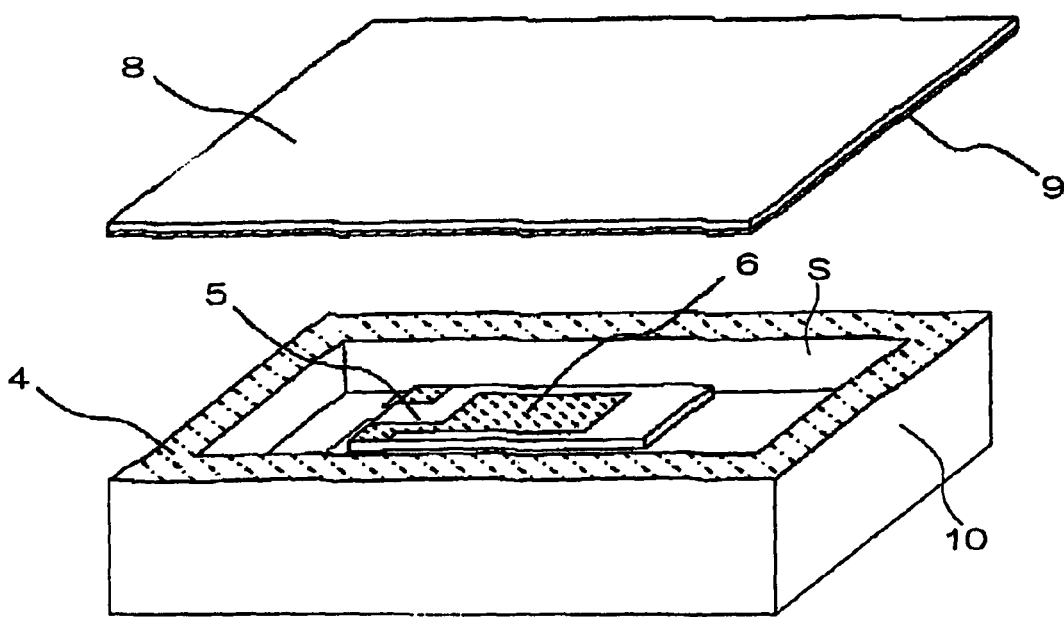
FIG. 2 is an exploded perspective view of the crystal oscillator manufactured by the manufacturing method according to the present invention.

FIG. 1 is a cross-sectional view showing a crystal oscillator manufactured by a method of manufacturing an electronic device according to the present invention. FIG. 2 is an exploded perspective view of the crystal oscillator. The crystal oscillator roughly comprises an insulating base 10, a crystal oscillation element 5 serving as a piezoelectric oscillation element, and a cover member 8.

The insulating base 10 is formed of a ceramic material such as glass-ceramics or alumina-ceramics, for example. The insulating base 10 has a cavity S opening upward. A pair of connecting pads 2 is provided on a bottom surface S1 of the cavity S. A conductor layer 4 is formed in an annular shape at a peripheral edge of the opening of the cavity. External terminals 3 such as an input terminal, an output terminal, and a ground terminal are provided on a lower surface of the insulating base 10.

The pair of connecting pads 2 is electrically connected to an oscillation electrode 6 in the crystal oscillation element 5, described later, through conductive adhesives. The pair of connecting pads 2 is electrically connected to the input terminal and the output terminal on the lower surface of the insulating base 10 through a conductor pattern on the insulating base 10 or a via conductor within the insulating base 10, for example.

On the other hand, the conductor layer 4 is electrically connected to the cover member 8, described later, through a conductive joining material 9. The conductor layer 4 is electrically connected to the ground terminal on the lower surface of the insulating base 10 through the via conductor within the insulating base 10, for example.

When the crystal oscillator is carried on an external electric circuit such as a mother board, the above-mentioned external terminal 3 is electrically connected to a circuit wiring in the external electric circuit through conductive adhesives such as a solder.

The crystal oscillation element 5 is carried on a bottom surface S1 of the cavity S.

The crystal oscillation element 5 is constructed by applying and forming the pair of oscillation electrodes 6 on both main surfaces of a crystal piece obtained by cutting along a predetermined crystal axis. Application of a varied voltage from the outside to the crystal piece through the pair of oscillation electrodes 6 causes thickness sliding oscillation at a predetermined frequency.

The crystal oscillation element 5 is carried on the bottom surface of the cavity S of the insulating base 10 by electrically and mechanically connecting the oscillation electrodes 6 applied to both main surfaces thereof and the corresponding connecting pads 2 on an upper surface of the insulating base 10 through conductive adhesives 7.

Furthermore, the cover member 8 composed of a metal is attached to the peripheral edge of the opening of the cavity S of the insulating base 10. Examples of materials for the cover member 8 include 42 alloy, covar, and phosphor bronze. A lower end of the cover member 8 is attached to the conductor layer 8 at the peripheral edge of the opening of the cavity S by wax. The joining material 9 is constructed by laminating an Ni layer and an Au—Sn layer in this order from the side of the cover member 8, for example. The thickness of the Ni layer is 2 μm to 8 μm, and the thickness of the Au—Sn layer is 10 μm to 30 μm.

An example of the conductor layer 4 is one having a three-layer structure constructed by laminating a metallization layer composed of tungsten, molybdenum, or the like, an Ni layer, and an Au layer in this order, for example. The thickness of the metallization layer may be 10 μm to 20 μm, the thickness of the Ni layer may be 2 μm to 8 μm, and the thickness of the Au layer may be 0.7 μm to 1.4 μm.

The cover member 8 is for air-tightly sealing the crystal oscillation element 5 with the crystal oscillation element 5 accommodated in an area surrounded by the cover member 8 and the insulating base 10. The cover member 8 is electrically connected to the ground terminal on the lower surface of the insulating base 10 through the conductor layer 4, previously described. Thus, the cover member 8 is held at a ground potential when the crystal oscillator is used. The crystal oscillation element 5 is satisfactorily protected from an unnecessary electrical function from the outside, for example, noise by a shielding effect of the cover member 8.

In the above-mentioned crystal oscillator, therefore, a predetermined voltage from the outside is applied to the oscillation electrode 6 in the crystal oscillation element 5 through the input and output terminals provided on the lower surface of the insulating base 10. The crystal oscillation element 5 is set into thickness sliding oscillation at a predetermined frequency corresponding to characteristics thereof, so that a reference signal having a predetermined frequency is oscillated and outputted by an external oscillation circuit on the basis of the resonance frequency of the crystal oscillator.

Such a reference signal is utilized as a clock signal in electronic and communication equipment such as portable communication equipment.

Figure 3A:
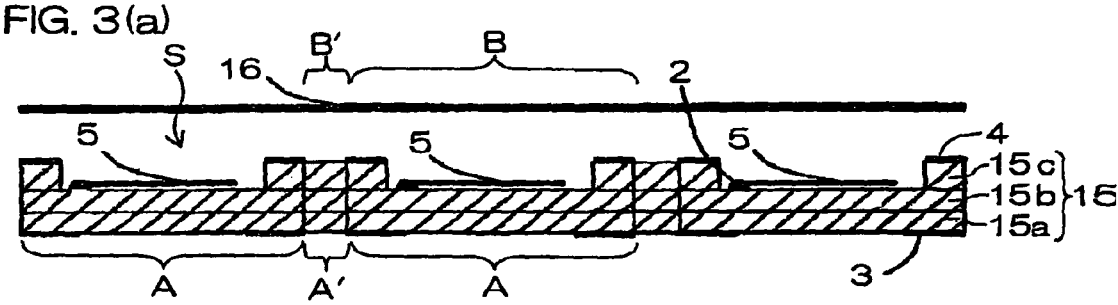
FIGS. 3 (a) to 3 (c) are cross-sectional views for explaining the steps of manufacturing an electronic device according to an embodiment of the present invention.
Figure 3B:
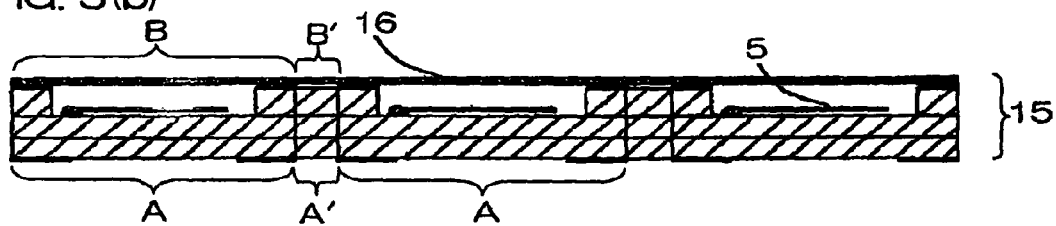
Figure 3C:
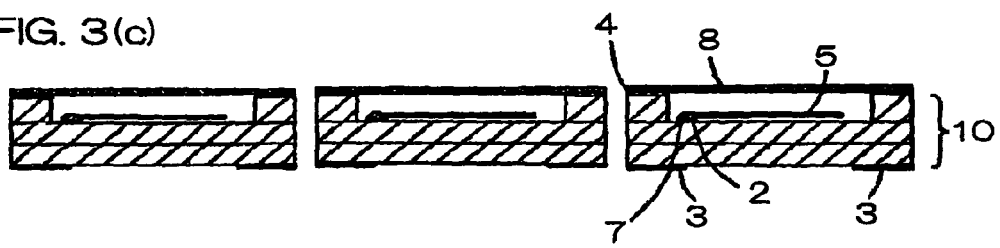

A method of manufacturing the above-mentioned crystal oscillator will be then described using FIGS. 3 (a) to 3 (c).

First, a master substrate 15 having a plurality of substrate areas A arranged in a matrix shape, that is, with a matrix of m columns and n rows (n and m are integers of not less than 1, unless n=m=1) is prepared, and a crystal oscillation element 5 is carried on each of the substrate areas A of the master substrate 15, as shown in FIG. 3 (a).

The master substrate 15 is formed by laminating two layers of single flat plate-shaped substrates 15a and 15b composed of a ceramic material such as glass-ceramics or alumina ceramics and laminating one layer of substrate 15c composed of a ceramic material thereon. The substrate 15c has a hole forming a rectangular cavity S corresponding to the substrate area A.

A pair of connecting pads 2 is formed at a position serving as a bottom surface of the cavity S on an upper surface of each of the substrate areas A, and a conductor layer 4 surrounding a peripheral edge of an opening of the cavity S is applied and formed thereon. External terminals 3 such as input and output terminals and a ground terminal are applied and formed on a lower surface thereof.

The master substrate 15 is manufactured by printing and applying conductor pastes serving as the connecting pad 2, the external terminal 3, and a conductor pattern in a predetermined pattern on a surface of a ceramic green sheet obtained by adding and mixing a suitable organic solvent or the like to and with ceramic material powders composed of alumina ceramics or the like, laminating a plurality of conductor pastes, press-molding the laminated conductor pastes, and then calcining the press-molded conductor pastes at high temperatures.

The crystal oscillation elements 5 are respectively carried on bottom surfaces of the cavities S in the substrate areas A of the obtained master substrate 15. Oscillation electrodes 6 in the crystal oscillation element 5 and the connecting pads 2 on the upper surface of the master substrate 15 are electrically and mechanically connected to each other through conductive adhesives 7. A joining material 9 is formed on a conductor layer 4 at the peripheral edge of the opening of the cavity S.

Figure 5:
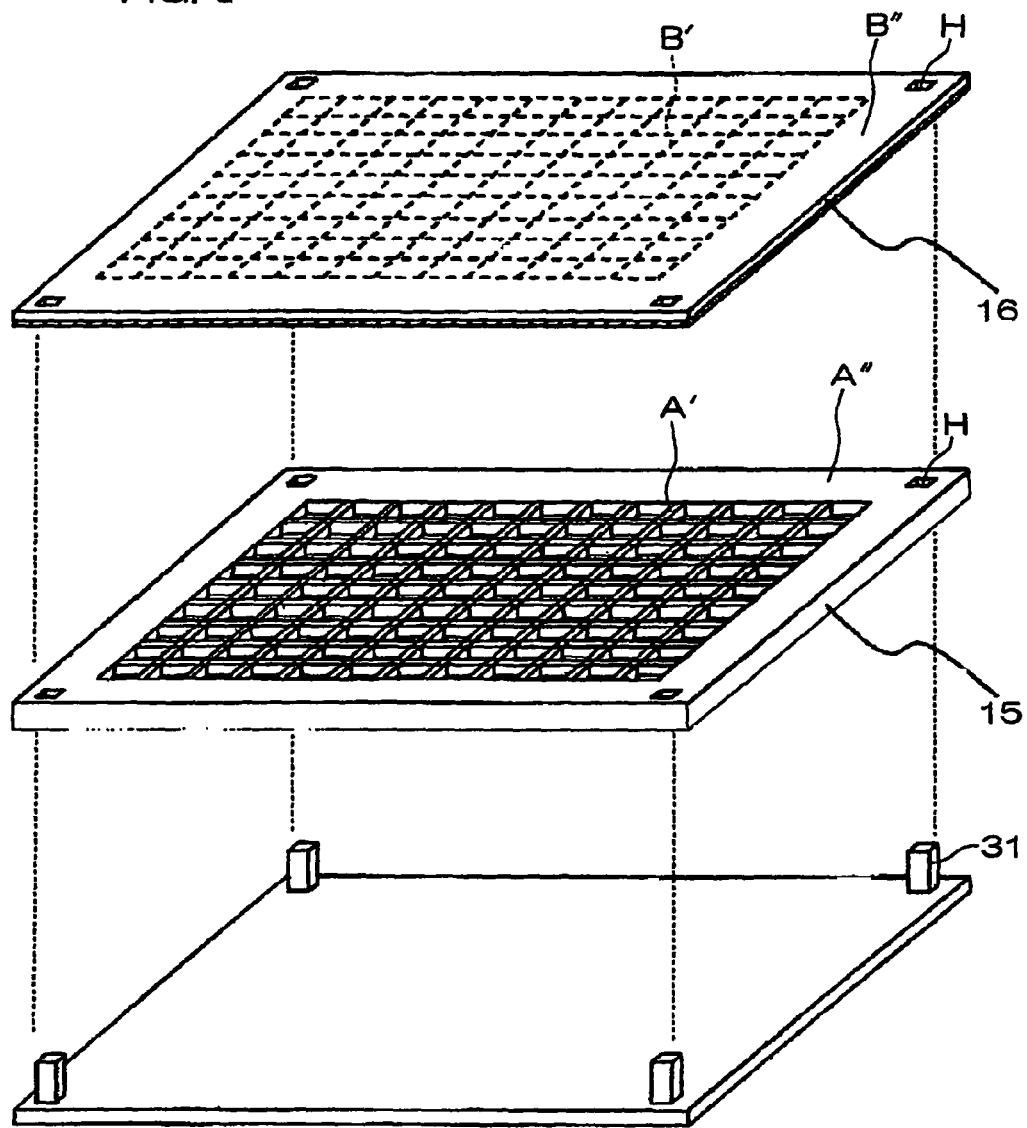
FIG. 5 is a perspective view for explaining a method of aligning the master substrate 15 and the main cover 16.

In the present embodiment, a cut area A' is provided between the substrate areas A arranged in a matrix shape, as shown in FIG. 3 (a). Further, a cut area A" is provided along the outer periphery of the whole of the substrate area A (FIG. 5).

Figure 4:
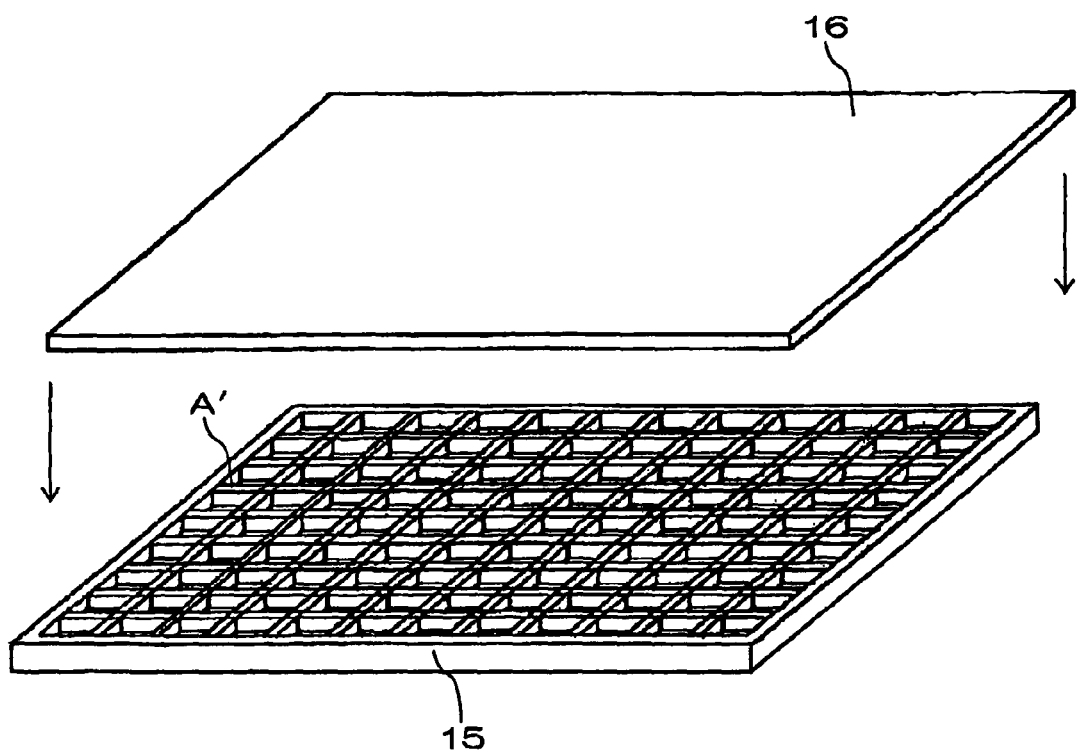
FIG. 4 is a perspective view for explaining the step of placing a main cover 16 made of a metal on a master substrate 15.

A main cover 16 made of a metal is then placed and joined on the master substrate 15 in such a manner that the crystal oscillation element 5 is sealed, as shown in FIGS. 4 and 3 (b).

The main cover 16 has cover areas B having a one-to-one correspondence with the substrate areas A of the master substrate 15. In the present embodiment, the main cover 16 is provided with a cut area B' corresponding to the cut area A' and is provided with a cut area B" corresponding to the cut area A", similarly to the master substrate 15 (see FIG. 5).

The main cover 16 is manufactured by processing a metal plate having a thickness of 60 µm to 100 µm composed of a metal such as 42 alloy, covar, or phosphor bronze in a predetermined shape by sheet metal processing conventionally well-known.

The main cover 16 is placed on the master substrate 15, and is then put in a heating furnace held at temperatures of 300° C. to 350° C., to heat and melt the joining material 9 at high temperatures. Consequently, the main cover 16 is joined to the master substrate 15. Thereafter, the master substrate 15 and the main cover 16 that are integrated with each other are gradually cooled to room temperature.

It is preferable that the above-mentioned series of joining steps is carried out in an atmosphere of inert gas such as nitrogen gas or argon gas. Thus, a space accommodating the crystal oscillation element 5 is filled with the inert gas, thereby making it possible to effectively prevent the crystal oscillation element 5 from being corroded and degraded by oxygen, water in air, or the like.

The master substrate 15 and the main cover 16 may be aligned with each other by forming, when the main cover 16 is joined to the master substrate 15, predetermined through holes H at four corners of each of the cut areas A" and B" respectively provided in the outer peripheries of the master substrate 15 and the main cover 16 and respectively fitting and inserting positioning pins 31 into the through holes H, as shown in FIG. 5.

Figure 6:
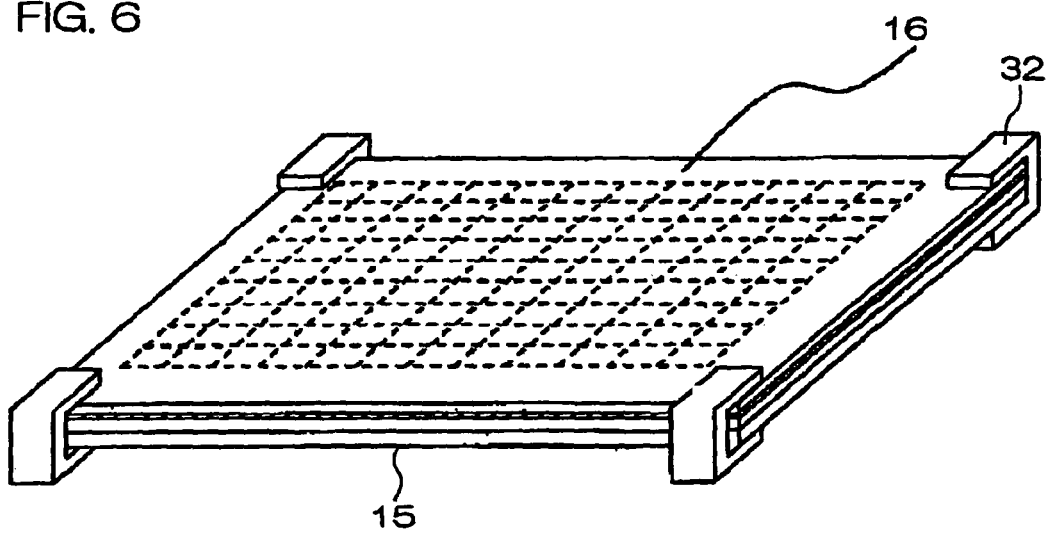
FIG. 6 is a perspective view for explaining another method of aligning the master substrate 15 and the main cover 16.

Furthermore, a clip 32 may be used as a fixing jig by joining the master substrate 15 and the main cover 16 to each other after temporarily fixing them using the clip 32 and mounting the clip 32 in a cutting step, described later, as shown in FIG. 6. A C-type clamp or the like is used for the clip 32.

Finally, the master substrate 15 and the main cover 16 that are integrated with each other are divided and cut along the outer periphery of each of the substrate areas A, that is, the cut area A', as shown in FIG. 3 (c).

The master substrate 15 and the main cover 16 are together cut from the side of the master substrate 15 using a dicer, for example. Consequently, a plurality of crystal oscillators is simultaneously obtained.

Although the cutting direction may be a direction from the side of the master substrate, as described above, it may be a direction from the side of the main cover. Which of the directions may be suitably selected in relation to materials used for the cutting means, the master substrate 15, and the main cover 16, for example.

Since the crystal oscillator is manufactured in the foregoing steps, the insulating base 10 and the cover member 8 need not be previously divided into pieces prior to assembling the crystal oscillator. Therefore, the insulating base 10 and the cover member 8 can be simultaneously together cut.

Moreover, the master substrate 15 itself functions as a carrier in assembling the crystal oscillator. The necessity of complicated work for holding each of the pieces obtained by dividing the master substrate 15 in the carrier or mounting the cover member 8 on each of the pieces is fully eliminated.

Consequently, the assembling steps of the crystal oscillator are significantly simplified, thereby making it possible to improve the productivity of the crystal oscillator.

The above-mentioned embodiment can be subjected to the following changes.

Figure 7:
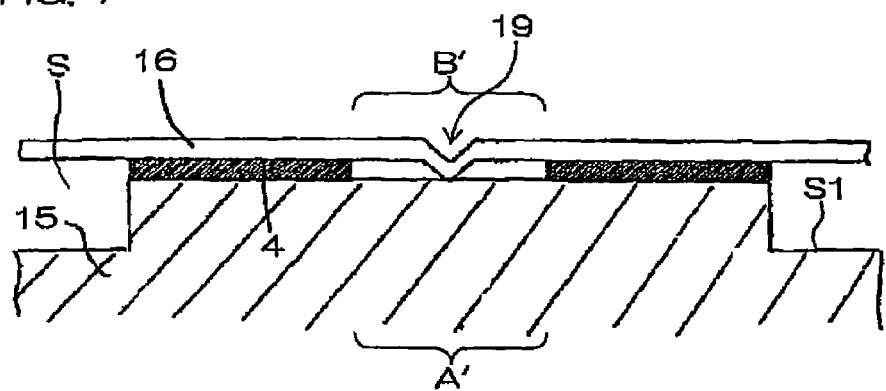
FIG. 7 is a cross-sectional view showing a state where the master substrate 15 and the main cover 16 are joined to each other at a peripheral edge of a recess.

FIG. 7 is a cross-sectional view showing a state where the master substrate 15 and the main cover 16 are joined to each other at the peripheral edge of the opening of the cavity S.

A groove 19 is formed along the outer periphery of the cover area B of the main cover 16, that is, the cut area B'. If the groove 19 is formed, the groove 19 becomes a guide in cutting the main cover 16 and the master substrate 15. Consequently, the master substrate 15 can be accurately divided along the outer periphery of the substrate area A. Thus, the production of the crystal oscillator is improved. Moreover, an electronic device with high dimensional precision can be obtained.

Furthermore, when a lower end surface of the protruding portion of the main cover 16 where the groove 19 is formed is abutted against an upper surface of the master substrate 15, the upper surface of the master substrate 15 supports the lower end surface of the protruding portion in cutting the main cover 16 and the master substrate 15 downward from above the main cover 16, thereby making it possible to prevent the main cover 16 from warping.

Figure 8:
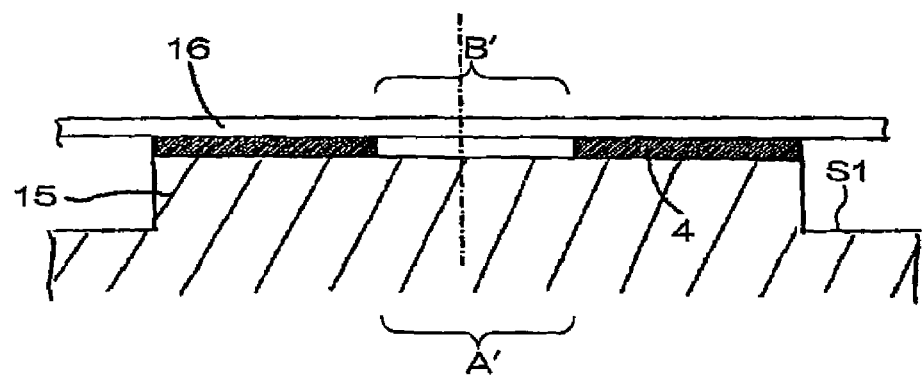
FIG. 8 is a cross-sectional view showing a state where a conductor layer 4 and a joining material 9 are previously divided in cut portions of the master substrate 15 and the main cover 16.

In the cutting step in the above-mentioned embodiment, the conductor layer 4 and the joining material 9 that join the master substrate 15 and the main cover 16 to each other may be previously divided in cut portions of the master substrate 15 and the main cover 16, as shown in FIG. 8. Thus, the conductor layer 4 and the joining material 9 do not exist in cutting the master substrate 15 and the main cover 16. Therefore, a dicer is barely brought into contact with the joining material 9. This effectively prevents sealing properties from being degraded due to the occurrence of problems such as a crack in the joining material 9 by contact with the dicer. Consequently, it is preferable that the conductor layer 4 and the joining material 9 that join the master substrate 15 and the main cover 16 to each other do not exist in the cut portions of the master substrate 15 and the main cover 16.

Although in the above-mentioned embodiment, the joining material 9 is formed in the conductor layer 4 at the peripheral edge of the opening of the cavity S, the joining material 9 may be formed in an area corresponding to the cover area B on a contact surface of the main cover 16 with the conductor layer 4 or a joint surface of the main cover 16 with the master substrate 15.

Furthermore, although in the above-mentioned embodiment, the cut area A' is provided between the substrate areas A of the master substrate 15, the substrate areas A may be arranged in close proximity to each other without providing the cut area A'. The same is true for the main cover 16.

Furthermore, although in the above-mentioned embodiment, the crystal oscillation element is used as a piezoelectric oscillation element to construct the crystal oscillator, the present invention is also applicable in an electronic device using the other piezoelectric oscillation elements, for example, a surface acoustic wave element, a filter element, a resonator, etc.

Although in the above-mentioned embodiment, only the piezoelectric oscillation element is accommodated in the cavity S, an IC element having an oscillation circuit for outputting an oscillation signal corresponding to the oscillation frequency of the piezoelectric oscillation element, together with the piezoelectric oscillation element, may be accommodated in the cavity S.

Another embodiment will be then described.

Figure 9:
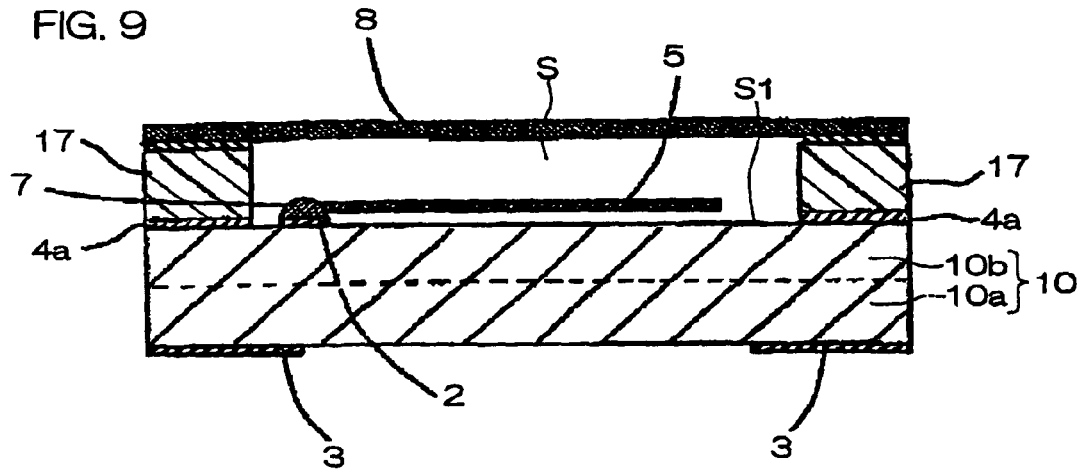
FIG. 9 is a cross-sectional view showing the internal configuration of a crystal oscillator (an electronic device) manufactured by a method of manufacturing an electronic device according to the present invention.

FIG. 9 is a cross-sectional view showing a crystal oscillator manufactured by a method of manufacturing an electronic device according to the present invention. The configuration of the crystal oscillator shown in FIG. 9 is common to that of the crystal oscillator shown in FIG. 1. Only portions different from those shown in FIG. 1 will be described.

In the present embodiment, an insulating base 10 is constructed by laminating two layers of single flat plate-shaped substrates 10a and 10b composed of a ceramic material. Further, one layer of seal ring 17 composed of a metal material is further laminated thereon.

The seal ring 17 is formed so as to surround a crystal oscillation element 5 in the vicinity of a substrate area A of the substrate 10a. The seal ring 17 is connected to a conductor layer 4a formed on an upper surface of the flat plate-shaped substrate 10b through a joining material 9 such as Au—Ni.

On the other hand, the conductor layer 4a is electrically connected to a ground terminal on a lower surface of the insulating base 10 through a via conductor or the like within the insulating base 10.

The seal ring 17 functions as a spacer for ensuring a predetermined space where the crystal oscillation element 5 is arranged between the insulating base 10 and a cover member 8, and is formed so as to have an annular shape by a metal such as 42 alloy, cover, or phosphor bronze. The seal ring 17 is formed thick such that an upper surface thereof is positioned above an upper surface of the crystal oscillation element 5 when the seal ring 17 is carried on the insulating base 10.

The cover member 8 is attached to an upper surface of the seal ring 17 through the joining material 9 such as Au—Ni, so that an accommodation area S of the crystal oscillation element 5 surround by an inner peripheral surface of the seal ring 17 and an upper surface of the insulating base 10 is air-tightly sealed by the cover member 8.

The cover member 8 is formed so as to have a flat plate shape by the same metal material as the seal ring 17, previously described, for example, 42 alloy, cover, or phosphor bronze.

The cover member 8 is electrically connected to the ground terminal on the lower surface of the insulating base 10 through the seal ring 17 and the conductor layer 4a on the upper surface of the insulating base 10, described above. Thus, the cover member 8 is held at the ground potential when the crystal oscillator is used, so that the crystal oscillation element 5 is satisfactorily protected from an unnecessary electrical function from the outside, for example, noise, by the shielding effect of the cover member 8.

Figure 10A:
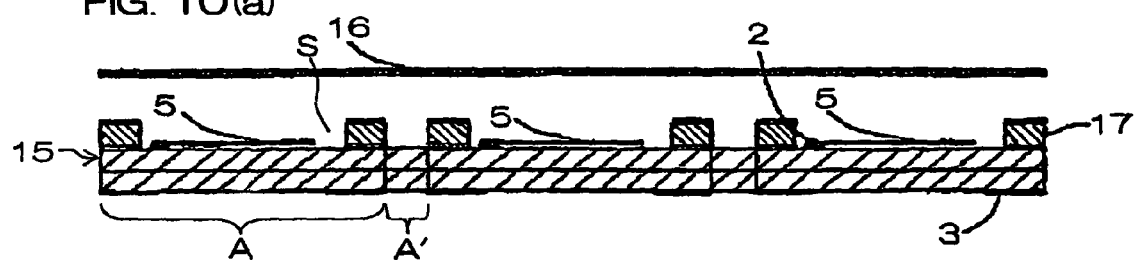
FIGS. 10 (a) to 10 (c) are cross-sectional views for explaining the steps of manufacturing an electronic device according to an embodiment of the present invention.
Figure 10B:
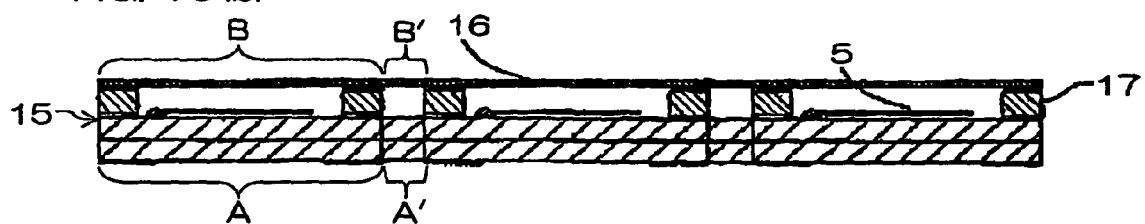
Figure 10C:
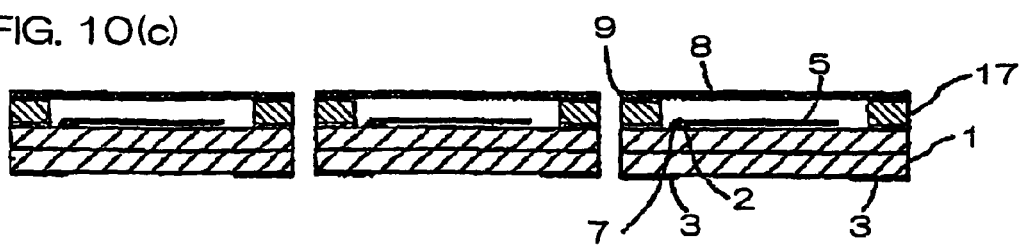

A method of manufacturing the above-mentioned crystal oscillator will be then described using FIGS. 10 (a) to 10 (c).

First, a master substrate 15 having a plurality of substrate areas A arranged in a matrix shape of m columns by n rows (n and m are integers of not less than 1, unless n=m=1) is prepared, and a crystal oscillation element 5 and a seal ring 17 surrounding the crystal oscillation element 5 are carried on each of the substrate areas A of the master substrate 15, as shown in FIG. 10 (a).

The master substrate 15 is formed by laminating a plurality of insulating layers composed of a ceramic material such as glass-ceramics or alumina-ceramics, for example, with a conductor pattern interposed therebetween. In the master substrate 15, for each of the substrate areas A, a pair of connecting pads 2 and a conductor layer 4a for joining are applied and formed on an upper surface of the substrate area A, and external terminals 3 such as input and output terminals and a ground terminal are applied and formed on a lower surface thereof.

Figure 11:
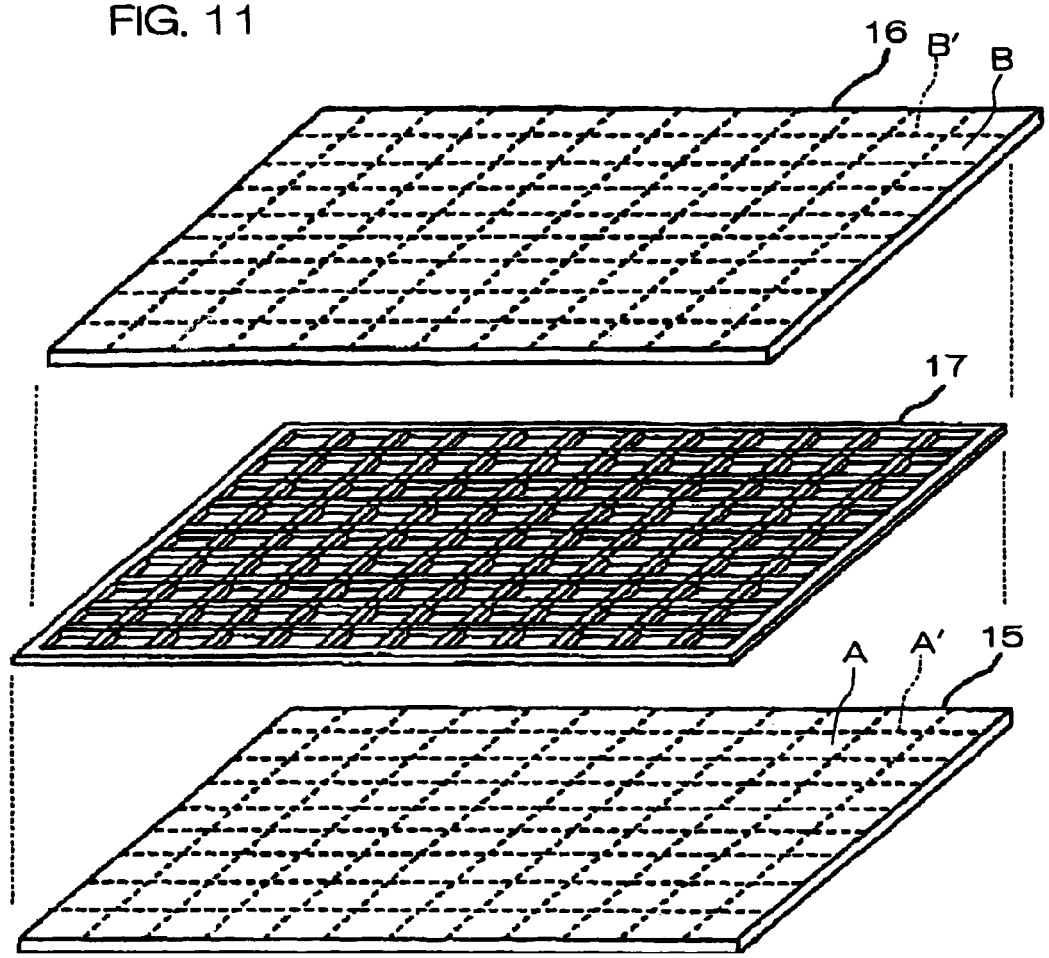
FIG. 11 is a perspective view for explaining the steps of manufacturing an electronic device according to an embodiment of the present invention.

The master substrate 15 has a predetermined cut area A', as shown in FIGS. 10 and 11, provided between the substrate areas A arranged in a matrix shape.

After the seal ring 17 is placed on each of the substrate areas A of the master substrate 15 through a joining material such as Au—Ni, and the joining material is heated and melted at high temperatures, to join a lower surface of the seal ring 17 to the conductor layer 4a on the upper surface of the master substrate 15. Thereafter, the crystal oscillation elements 5 are respectively carried inside the seal rings 17. The crystal oscillation element 5 is carried on the master substrate 15 by electrically and mechanically connecting an oscillation electrode and the corresponding connecting pad 2 on the upper surface of the master substrate 15 through conductive adhesives 7.

In the present embodiment, the plurality of seal rings 17 are not respectively carried on the substrate areas A. The plurality of seal rings 17 arranged in a matrix shape are placed and carried on the master substrate 15 after being mutually connected and integrated to one another, as shown in FIG. 11. Thus, the plurality of seal rings 17 are together attached to the corresponding substrate areas A of the master substrate 15.

The connected-type seal ring 17 is manufactured by subjecting a metal plate having a thickness of 150 μm to 250 μm composed of a metal such as 42 alloy, cover, or phosphor bronze to punching processing conventionally known to provide a plurality of through holes having a one-to-one correspondence with the substrate areas A of the master substrate 15.

A main cover 16 made of a metal having a plurality of cover areas B having a one-to-one correspondence with the substrate areas A of the master substrate 15 is then placed and joined on the seal ring 17 in such a manner that the crystal oscillation element 5 is sealed, as shown in FIG. 10 (b).

An example of the main cover 16 is a metal plate having a thickness of 60 μm to 100 μm composed of a metal such as 42 alloy, covar, or phosphor bronze. The main cover 16 is provided with a predetermined cut area B' between the cover areas B, similarly to the master substrate 15 previously described.

In this step, the main cover 16 is placed on the seal ring 17 on the upper surface of the master substrate 15 in such a manner that the crystal oscillation element 5 is arranged in the substrate area A corresponding to each of the cover areas B, and both the main cover 16 and the seal ring 17 are then joined to each other by seam welding (resistive welding) conventionally known so that the main cover 16 is attached and fixed to the upper surface of the seal ring 17.

It is preferable that the above-mentioned series of joining steps is carried out in an atmosphere of inert gas such as nitrogen gas or argon gas. Thus, a space accommodating the crystal oscillation element 5 is filled with the inert gas, thereby making it possible to effectively prevent the crystal oscillation element 5 from being corroded and degraded by oxygen, water in air, or the like.

The master substrate 15 and the main cover 16 may be aligned with each other by forming, when the main cover 16 is placed on the master substrate 15, predetermined through holes at four corners of each of the cut areas respectively provided in the outer peripheries of the master substrate 15 and the main cover 16 and respectively fitting and inserting positioning pins into the through holes. Further, a clip may be further used as a fixing jig by joining the master substrate 15 and the main cover 16 to each other after temporarily fixing them using the clip and mounting the clip in a cutting step, described later.

Finally, the master substrate 15, the main cover 16, and the seal ring 17 that are integrated with one another are together divided and cut along the outer periphery of each of the substrate areas A, thereby simultaneously manufacturing a plurality of crystal oscillators, as shown in FIG. 10 (c).

The master substrate 15, the main cover 16, and the seal ring 17 are cut by together dividing them from the side of the master substrate 15 using a dicer or the like, for example. Consequently, a plurality of crystal oscillators is simultaneously obtained. The cutting direction may be a direction from the side of the main cover 16 in place of a direction from the side of the master substrate 15, as described above.

When the crystal oscillator is manufactured in the foregoing steps, the insulating base 10, the cover member 8, and the seal ring 17 need not be previously divided into pieces prior to assembling the crystal oscillator. Therefore, the insulating base 10, the cover member 8, and the seal ring 17 can be simultaneously cut by together dividing them.

Moreover, in this case, the master substrate itself can function as a carrier in assembling the crystal oscillator. Therefore, the necessity of complicated work for holding each of the pieces obtained by dividing the master substrate 15 in the carrier or mounting the cover member 8 on each of the pieces is fully eliminated.

Consequently, the assembling steps of the crystal oscillator are significantly simplified, thereby making it possible to improve the production of the crystal oscillator.

Figure 12:
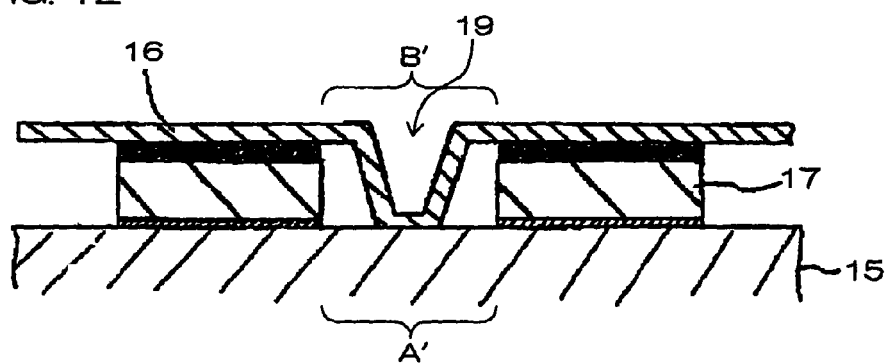
FIG. 12 is a cross-sectional view for explaining the steps of manufacturing an electronic device according to another embodiment of the present invention.

If a groove 19 is formed along the cut area B' in the main cover 16, as shown in FIG. 12, the master substrate 15 can be accurately divided along the outer periphery of the substrate area A only by cutting the main cover 16 and the master substrate 15 along the groove 19.

Furthermore, when a lower end surface of the protruding portion on the back surface of the main cover 16 is abutted against the upper surface of the master substrate 15, the upper surface of the master substrate 15 supports the lower end surface of the protruding portion in cutting the main cover 16 and the master substrate 15 downward from above the main cover 16, thereby making it possible to prevent the main cover 16 from warping. Thus, the production of the crystal oscillator is improved. Moreover, an electronic device with high dimensional precision can be obtained.

Although in the above-mentioned embodiment, the seal rings 17 that are connected to one another are placed and carried on the master substrate 15, as shown in FIG. 11, the present invention is not limited to the same. For example, the plurality of seal rings 17 previously divided may be respectively carried on the substrate areas A of the master substrate 15.

Furthermore, although in the above-mentioned embodiment, the cut area A' is provided between the substrate areas A of the master substrate 15, the substrate areas A may be arranged in close proximity to each other without providing the cut area A'. The same is true for the main cover 16.

Another embodiment of the present invention will be described.

Figure 13:
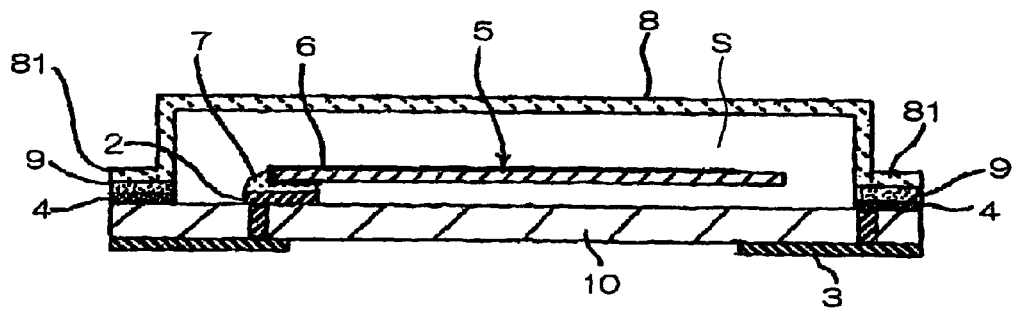
FIG. 13 is a cross-sectional view for explaining the steps of manufacturing an electronic device according to another embodiment of the present invention.

FIG. 13 is a cross-sectional view showing a crystal oscillator manufactured by a method of manufacturing an electronic device according to the present invention. The crystal oscillator shown in FIG. 13 roughly comprises an insulating base 10, a crystal oscillation element 5 serving as a piezoelectric oscillation element, and a cover member 8.

The insulating base 10 is formed of the same ceramic material as that shown in FIG. 1 so as to have a rectangular shape. A pair of connecting pad 2 and a conductor layer 4 for joining arranged in an annular shape along the outer periphery of the insulating base 10 are provided on an upper surface of the insulating base 10. External terminals 3 such as an input terminal, an output terminal, and a ground terminal are provided on a lower surface of the insulating base 10.

The pair of connecting pads 2 is electrically connected to an oscillation electrode 6 in the crystal oscillation element 5, described later, through conductive adhesives 7. The pair of connecting pads 2 is electrically connected to the input terminal and the output terminal on the lower surface of the insulating base 10 through a conductor pattern on the insulating base 10 or a via conductor within the insulating base 10, for example.

On the other hand, the conductor layer 4 is electrically connected to the cover member 8, described later, through a conductive joining material 9. The conductor layer 4 is electrically connected to the ground terminal on the lower surface of the insulating base 10 through the via conductor within the insulating base 10, for example.

The crystal oscillation element 5 is carried on an upper surface of the insulating base 10.

The crystal structure and the oscillation principle of the crystal oscillation element 5 are the same as those described with reference to FIG. 1.

The crystal oscillation element 5 is carried on the upper surface of the insulating base 10 by electrically and mechanically connecting oscillation electrodes 6 applied to both main surfaces thereof and the corresponding connecting pads 2 on the upper surface of the insulating base 10 through the conductive adhesives 7.

Furthermore, the cover member 8 composed of a metal is attached to the upper surface of the insulating base 10.

Although a material for the cover member 8 is the same as that described with reference to FIG. 1, a cavity S opening downward is formed at the center of the cover member 8, and an abutted leg 81 is provided in an annular shape in the outer periphery of the cavity S.

The cover member 8 is attached and joined to the upper surface of the insulating base 10 by attaching a lower end of the abutted leg 81 to the conductor layer 4 with wax through a joining material 9 such as Au—Ni or Au—Sn.

The cover member 8 is for air-tightly sealing an area where the crystal oscillation element 5 is carried by accommodating the crystal oscillation element 5 within the cavity S and specifically in an area surrounded by an inner surface of the cavity S and the upper surface of the insulating base 10.

The cover member 8 is electrically connected to the ground terminal on the lower surface of the insulating base 10 through the conductor layer 4 previously described. Thus, the cover member 8 is held at the ground potential when the crystal oscillator is used, so that the crystal oscillation element 5 is satisfactorily protected from an unnecessary electrical function from the outside, for example, noise by the shielding effect of the cover member 8.

A reference signal having a predetermined frequency is oscillated and outputted by an external oscillation circuit on the basis of the resonance of such a crystal oscillator. The reference signal is utilized as a clock signal in electronic and communication equipment such as portable communication equipment.

Figure 14A:
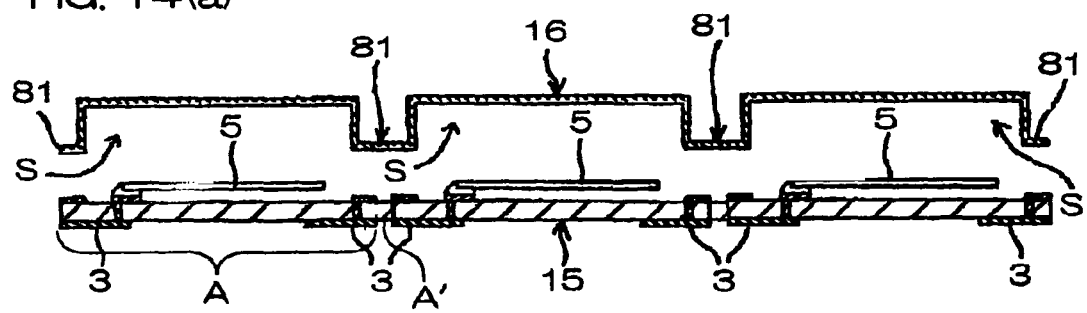
FIGS. 14 (a) to 14 (c) are cross-sectional views for explaining the steps of manufacturing an electronic device according to an embodiment of the present invention.
Figure 14B:
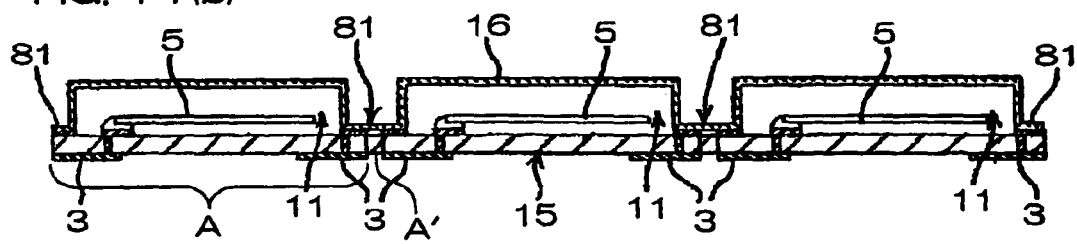
Figure 14C:
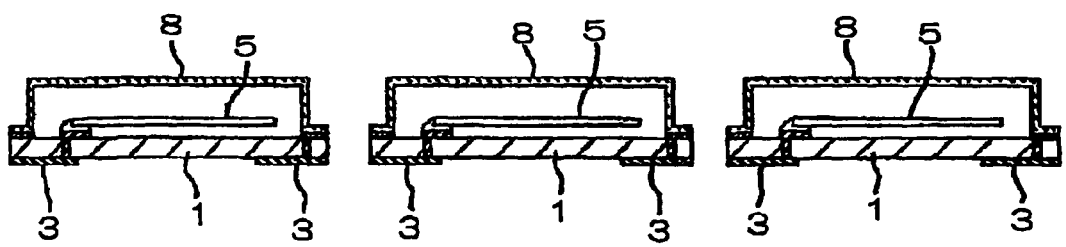

A method of manufacturing the above-mentioned crystal oscillator will be then described using FIGS. 14 (a) to 14 (c).

First, a master substrate 15 having a plurality of substrate areas A arranged in a matrix shape, that is, with a matrix of m columns and n rows (n and m are integers of not less than 1, unless n=m=1) is prepared, and a crystal oscillation element 5 is carried on each of the substrate areas A of the master substrate 15, as shown in FIG. 14 (a).

The master substrate 15 is composed of a ceramic material such as glass-ceramics or alumina-ceramics, for example. A connecting pad 2, an annular conductor layer 4, or the like is applied and formed on an upper surface of each of the substrate areas A, and external terminals 3 such as input and output terminals and a ground terminal are applied and formed on a lower surface thereof.

The master substrate 15 is manufactured by printing and applying conductor pastes serving as the connecting pad 2, the external terminal 3, and a conductor pattern in a predetermined pattern on a surface of a ceramic green sheet obtained by adding and mixing a suitable organic solvent or the like to and with ceramic material powders composed of alumina ceramics or the like, laminating a plurality of conductor pastes, press-molding the laminated conductor pastes, and then calcining the press-molded conductor pastes at high temperatures.

The crystal oscillation elements 5 are respectively carried on the substrate areas A of the obtained master substrate 15. An oscillation electrode 6 in the crystal oscillation element 5 and the connecting pad 2 on the upper surface of the master substrate 15 are electrically and mechanically connected to each other through a conductive joining material 9.

Figure 15:
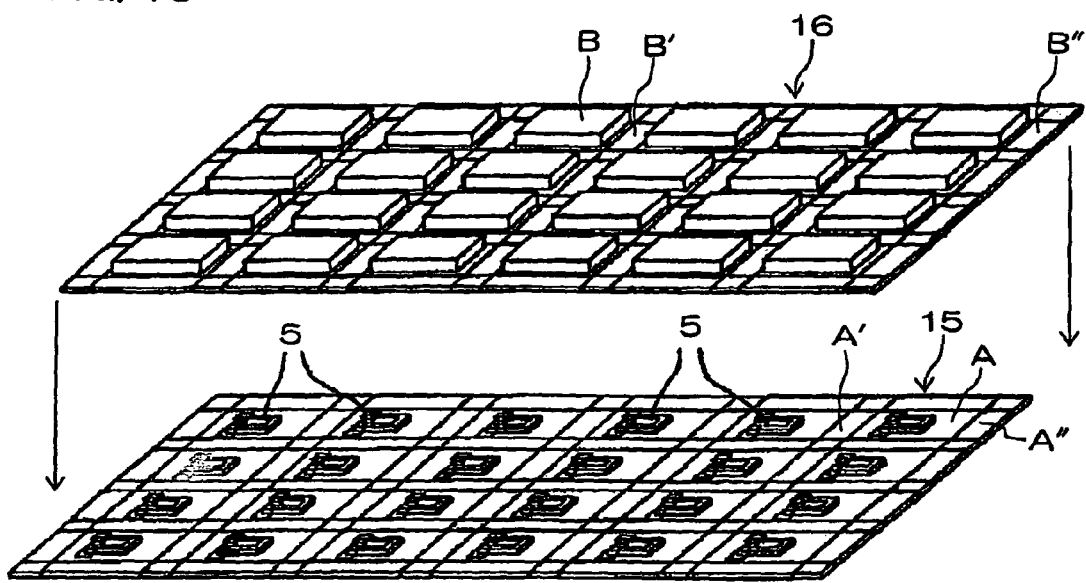
FIG. 15 is a perspective view for explaining the step of placing a main cover 16 made of a metal on a master substrate 15.

In the present embodiment, a predetermined cut area A' is provided between the substrate areas A arranged in a matrix shape, as shown in FIG. 15. Further, a cut area A" is provided along the outer periphery of the whole of the substrate area A.

A main cover 16 is manufactured by processing a metal plate having a thickness of 60 μm to 100 μm composed of a metal such as 42 alloy, covar, or phosphor bronze, for example, in a predetermined shape by sheet metal processing conventionally well-known.

In the obtained main cover 16, the plurality of cavities S, described above, are arranged in a matrix shape so as to have a one-to-one correspondence with the substrate areas A of the master substrate 15, and an abutted leg 81 is provided between adjacent recesses.

The main cover 16 has cover areas B having a one-to-one correspondence with the substrate areas A of the master substrate 15. The main cover 16 is also provided with a cut area B' corresponding to the cut area A' and is provided with a cut area B" corresponding to the cut area A", similarly to the master substrate 15.

The main cover 16 having the cavities S having a one-to-one correspondence with the substrate areas A of the master substrate 15 is then placed on the master substrate 15 in such a manner that the crystal oscillation elements 5 in the substrate areas A are respectively arranged within the cavities S, as shown in FIG. 14 (b). At this time, the abutted leg 81 is abutted against the conductor layer 4 in each of the substrate areas A through a joining material 9 such as Au—Ni or Au—Sn.

Thereafter, the main cover 16 is put in a heating furnace held at temperatures of 300° C. to 350° C., for example, to heat and melt the joining material 9 at high temperatures. Consequently, the main cover 16 is joined to the master substrate 15. Thereafter, the master substrate 15 and the main cover 16 that are integrated with each other are gradually cooled to room temperature.

The main cover 16 is provided with a plurality of cavities S having a one-to-one correspondence with the substrate areas A of the master substrate 15. When the main cover 16 and the master substrate 15 that are joined to each other by being heated to high temperatures are cooled to room temperature, therefore, stress created by the difference in an amount of heat shrinkage between the main cover 16 and the master substrate 15 is satisfactorily absorbed and alleviated by the deformation of the cavities S.

Consequently, the possibility that the master substrate 15 and the main cover 16 that are integrated with each other by joining will warp significantly by the above-mentioned stress is eliminated.

Thus, the lower surface of the master substrate 15 provided with the external terminals 3 is kept substantially flat, thereby obtaining a crystal oscillator superior in mounting properties when it is mounted on an external circuit board such as a mother board.

It is preferable that the above-mentioned series of joining steps is carried out in an atmosphere of inert gas such as nitrogen gas or argon gas. Thus, a space inside the cavity S accommodating the crystal oscillation element 5 is filled with the inert gas, thereby making it possible to effectively prevent the crystal oscillation element 5 from being corroded and degraded by oxygen, water in air, or the like.

Figure 16:
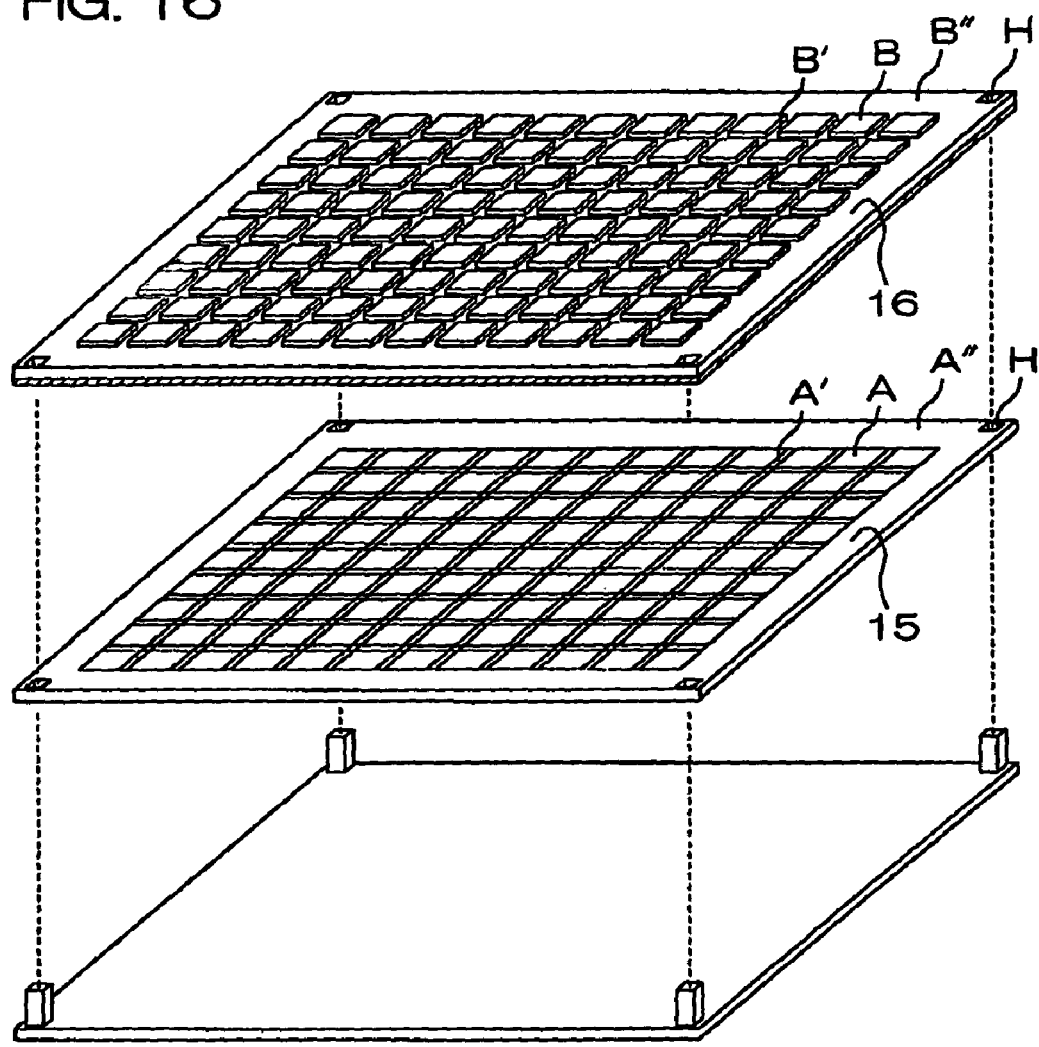
FIG. 16 is a perspective view for explaining a method of aligning the master substrate 15 and the main cover 16.

The master substrate 15 and the main cover 16 may be aligned with each other by forming, when the main cover 16 is placed on the master substrate 15, predetermined through holes H at four corners of each of the cut areas respectively provided in the outer peripheries of the master substrate 15 and the main cover 16 and respectively fitting and inserting positioning pins 31 into the through holes H, as shown in FIG. 16.

Figure 17:
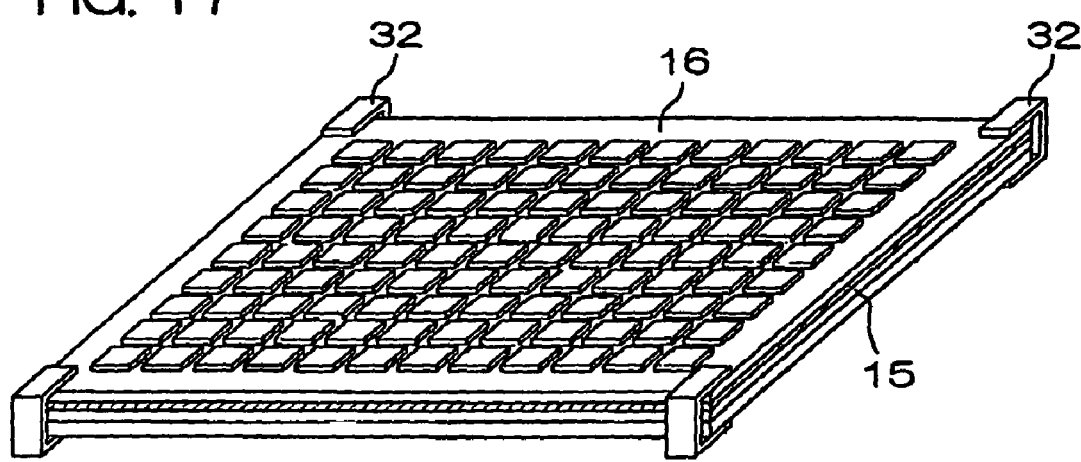
FIG. 17 is a perspective view for explaining another method of aligning the master substrate 15 and the main cover 16.

Furthermore, a clip 32 may be used as a fixing jig by joining the master substrate 15 and the main cover 16 to each other after temporarily fixing them using the clip 32 and mounting the clip 32 in a cutting step, described later, as shown in FIG. 17.

Finally, the master substrate 15 and the main cover 16 that are integrated with each other in the above-mentioned steps are divided and cut along the outer periphery of each of the substrate areas A, that is, in the cut area A', as shown in FIG. 14 (c).

The master substrate 15 and the main cover 16 are cut by together dividing them using a dicer or the like, for example. Consequently, a plurality of crystal oscillators is simultaneously obtained.

When the crystal oscillator is manufactured in the foregoing steps, the insulating base 10 and the cover member 8 need not be previously divided into pieces prior to assembling of the crystal oscillator. Therefore, the insulating base 10 and the cover member 8 can be simultaneously cut by together dividing them.

Moreover, in this case, the master substrate itself can function as a carrier in assembling the crystal oscillator. Therefore, the necessity of complicated work for holding each of the pieces obtained by dividing the master substrate 15 in the carrier or mounting the cover member 8 on each of the pieces is fully eliminated.

Consequently, the assembling steps of the crystal oscillator are significantly simplified, thereby making it possible to improve the production of the crystal oscillator.

The above-mentioned embodiment can be subjected to the following changes.

Figure 18:
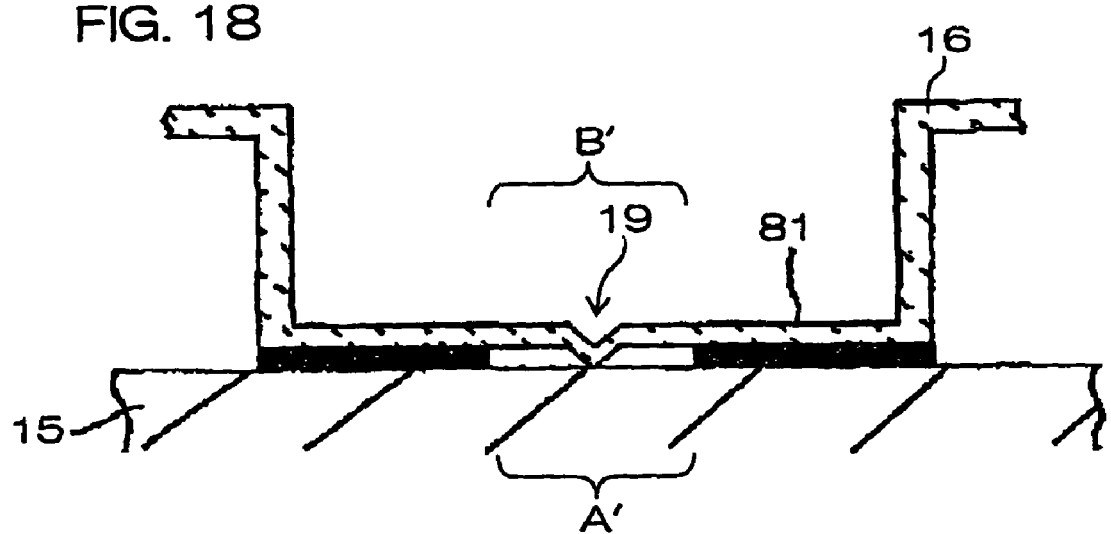
FIG. 18 is a cross-sectional view showing a state where the master substrate 15 and the main cover 16 are joined to each other in the outer periphery of a cover area.

FIG. 18 is a cross-sectional view showing a state where the master substrate 15 and the main cover 16 are joined to each other in the outer periphery of the substrate area A.

If a groove 19 is formed along the outer periphery of the substrate area A, i.e., the cut area B' in the main cover 16, as shown in FIG. 18, the groove 19 becomes a guide in cutting the main cover 16 and the master substrate 15. Consequently, the master substrate 15 can be accurately divided along the outer periphery of the substrate area A.

Furthermore, when a lower end surface of the protruding portion below the groove 19 is abutted against the upper surface of the master substrate 15, the upper surface of the master substrate 15 supports the lower end surface of the protruding portion in cutting the main cover 16 and the master substrate 15 downward from the side of the main cover 16, thereby making it possible to prevent the main cover 16 from warping.

Thus, the production of the crystal oscillator is improved. Moreover, an electronic device with high dimensional precision can be obtained.

Figure 19:
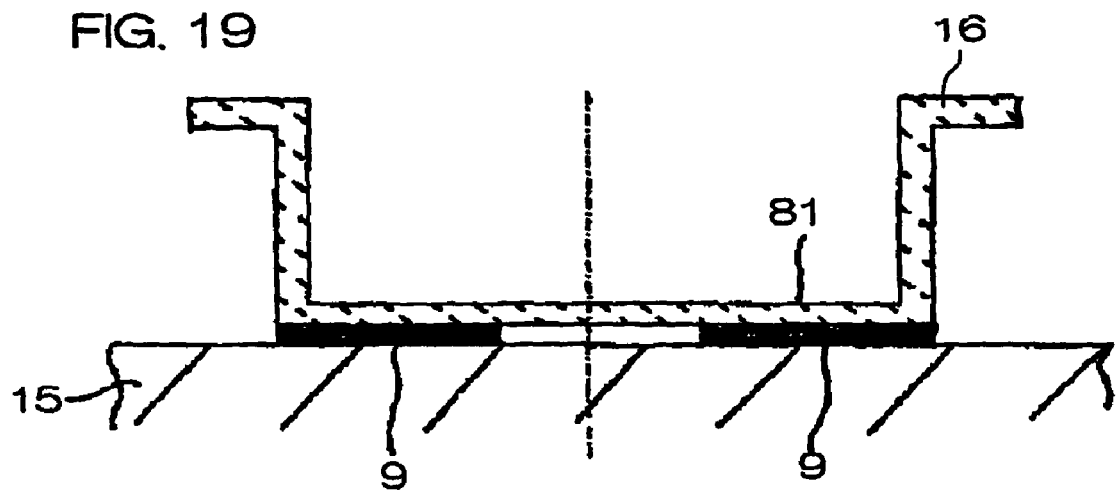
FIG. 19 is a cross-sectional view showing a state where a conductor layer 4 and a joining material 9 are previously divided in cut portions of the master substrate 15 and the main cover 16.

In the cutting step in the above-mentioned embodiment, the conductor layer 4 and the joining material 9 that join the master substrate 15 and the main cover 16 to each other may be previously divided in cut portions of the master substrate 15 and the main cover 16, as shown in FIG. 19. Thus, the conductor layer 4 and the joining material 9 do not exist in cutting the master substrate 15 and the main cover 16. Therefore, a dicer is barely brought into contact with the joining material 9. This makes it possible to effectively prevent sealing properties from being degraded due to the occurrence of problems such as a crack in the joining material 9 by contact with the dicer.

Figure 20:
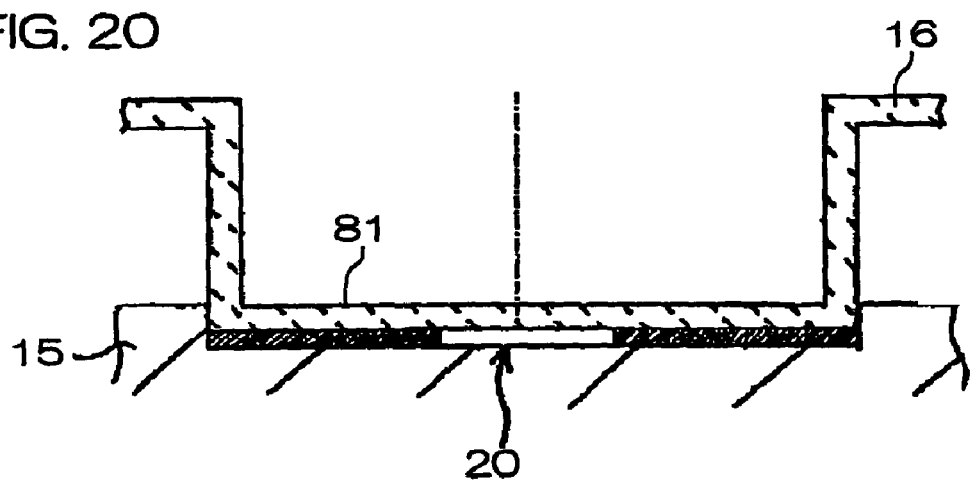
FIG. 20 is a cross-sectional view showing a state where an abutted leg 81 in the main cover 16 is fitted in a recessed groove 20 provided on a main surface of the master substrate 15.

Furthermore, a main surface of the master substrate 15 may be provided with a recessed groove 20 into which an abutted leg 81 in the main cover 16 is fitted and inserted, as shown in FIG. 20. The provision of the recessed groove 20 makes it easy to align the main cover 16 when the main cover 16 is placed on the master substrate 15 in the cutting step shown in FIG. 14 (c), described above. Workability in assembling the crystal oscillator also becomes good.

Consequently, it is preferable that the recessed groove 20 and the abutted leg 81 which is fitted and inserted into the recessed groove 20 and is abutted against a button surface of the recessed groove 20 are respectively provided on the main surface of the master substrate 15 and a lower part of the main cover 16.

Furthermore, although in the above-mentioned embodiment, the cut area A' is provided between the substrate areas A of the master substrate 15, the substrate areas A may be arranged in close proximity to each other without providing the cut area A'. The same is true for the main cover 16.

Furthermore, although in the above-mentioned embodiment, the master substrate 15 and the main cover 16 that are integrated with each other are together cut by a dicer, the present invention is not limited to the same. For example, the master substrate 15 and the main cover 16 that are integrated with each other may be cut using separate cutting means from both above and below.

The above-mentioned embodiment can be subjected to the following changes.

Figure 21:
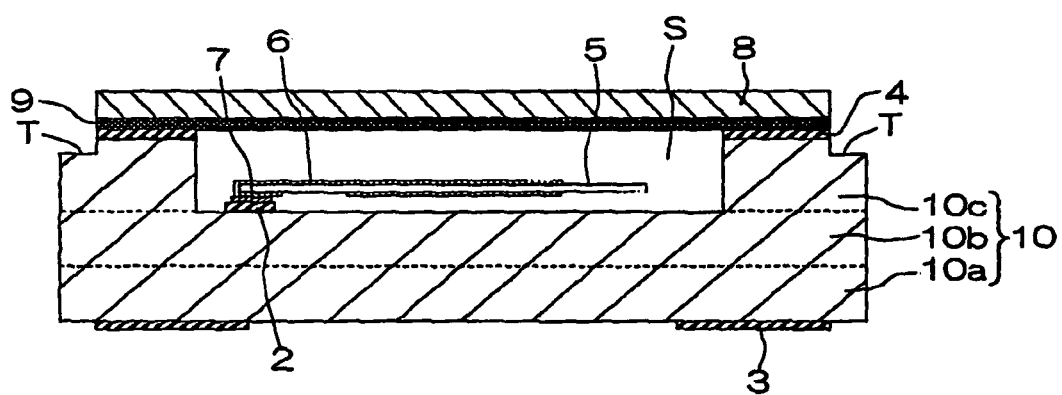
FIG. 21 is a cross-sectional view showing the internal configuration of a crystal oscillator manufactured by a manufacturing method according to the present invention.
Figure 22A:
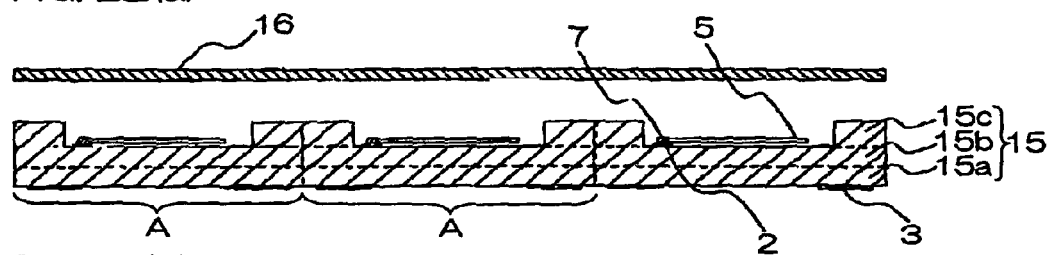
FIGS. 22 (a) to 22 (d) are cross-sectional views for explaining the steps of manufacturing an electronic device according to an embodiment of the present invention.
Figure 22B:
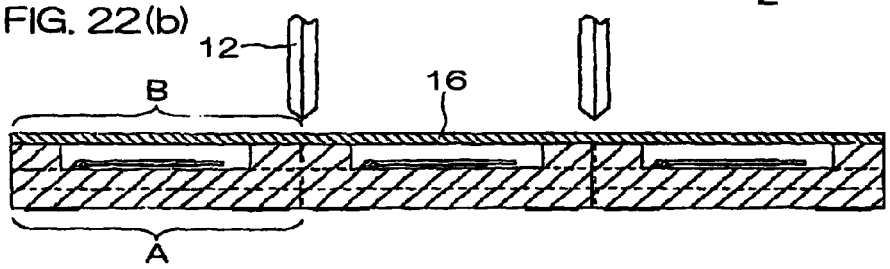
Figure 22C:
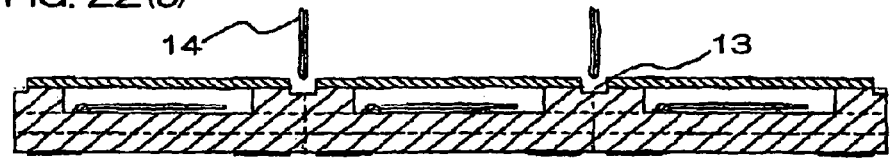
Figure 22D:
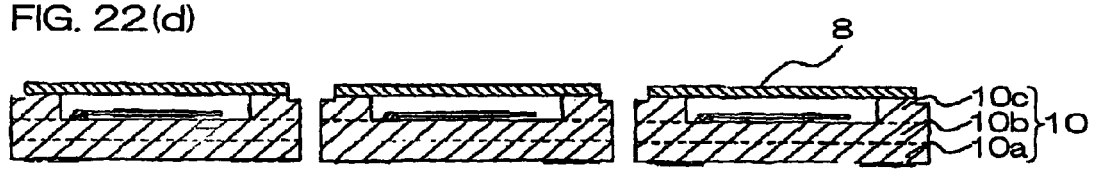
Figure 23:
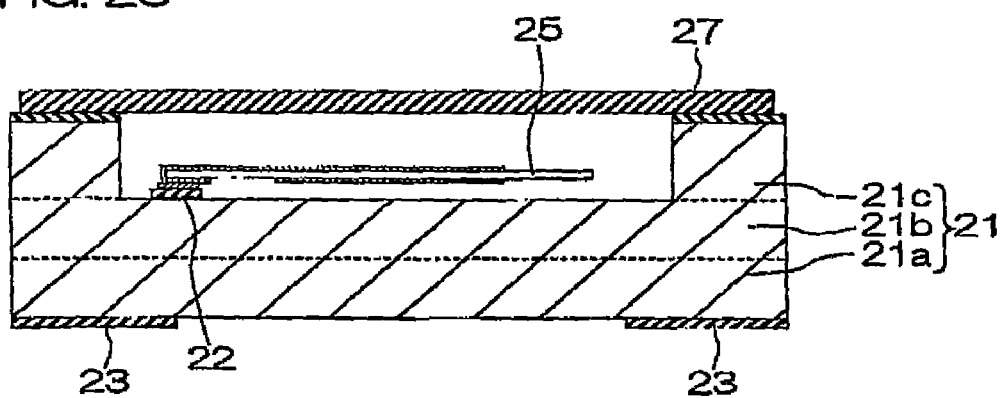
FIG. 23 is a cross-sectional view of a conventional crystal oscillator.

FIG. 21 is a cross-sectional view showing a crystal oscillator manufactured by a method of manufacturing an electronic device according to the present invention.

In the present embodiment, in an insulating base 10, two single flat plate-shaped insulating layers 10a and 10b composed of a ceramic material are laminated, and a single frame-shaped insulating layer 10c composed of a ceramic material is further formed thereon, as shown in FIG. 1.

The above-mentioned frame-shaped insulating layer 1c functions as a spacer for ensuring a predetermined space S where a crystal oscillation element 5 is arranged between the insulating base 10 and a cover member 8, described later. The cover member 8 is attached to an upper surface of the space S, so that an accommodation area of the crystal oscillation element 5 surrounded by an inner peripheral surface of the frame-shaped insulating layer 10c and an upper surface of the insulating base 10 is air-tightly sealed by the cover member 8.

The crystal oscillator shown in FIG. 21 differs from the crystal oscillator shown in FIG. 1 in that a cutting surface T exists in the frame-shaped insulating layer 10c in FIG. 21.

The cut surface T is formed because its cutting edge reaches the frame-shaped insulating layer 10c when the cover member 8 is cut.

A method of manufacturing the crystal oscillator will be then described using FIGS. 22 (a) to 22 (d).

First, a master substrate 15 having a plurality of substrate areas A arranged in a matrix shape of m columns and n rows (n and m are integers of not less than 1, unless n=m=1) is prepared, and a crystal oscillation element 5 is carried on each of the substrate areas A of the master substrate 15, as shown in FIG. 22 (a).

The master substrate 15 is formed by laminating flat plate-shaped insulating bases 15a and 15b composed of a ceramic material and a frame-shaped insulating base 15c through conductor patterns. A pair of connecting pads 2 is applied and formed on an upper surface of each of substrate areas A, and external terminals 3 such as input and output terminals and a ground terminal are applied and formed on a lower surface thereof.

The crystal oscillation elements 5 are respectively carried inside the frame-shaped insulating layers 10c.

A main cover 16 made of a metal having a plurality of cover areas B having a one-to-one correspondence with the substrate areas A of the master substrate 15 is then placed and joined on the frame-shaped insulating layer 15c in such a manner that the crystal oscillation element 5 is sealed, as shown in FIG. 22 (b).

An example of the main cover 16 is a metal plate having a thickness of 60 μm to 100 μm composed of a metal such as 42 alloy, covar, or phosphor bronze.

The main cover 16 is placed on the master substrate 15, and is then put in a heating furnace held at temperatures of 300° C. to 350° C., to heat and melt the joining material 9 at high temperatures. Consequently, the main cover 16 is joined to the master substrate 15. Thereafter, the master substrate 15 and the main cover 16 that are integrated with each other are gradually cooled to room temperature.

It is preferable that the above-mentioned series of joining steps is carried out in an atmosphere of inert gas such as nitrogen gas or argon gas. Thus, a space accommodating the crystal oscillation element 5 is filled with the inert gas, thereby making it possible to effectively prevent the crystal oscillation element 5 from being corroded and degraded by oxygen, water in air, or the like.

A joint member composed of the master substrate 15 and the main cover 16 that are integrated with each other in the above-mentioned joining step is cut by a first blade 12 along the outer periphery of each of the substrate areas A.

Consequently, a penetration groove 13 penetrating the main cover 16 in the thickness direction in such a manner that the master substrate 15 is partially exposed by cutting the main cover 16.

Used as the first blade 12 is a disk-shaped electroforming blade obtained by fixing a diamond abrasive coating or the like by electroforming, for example. Ni or the like is used as a binder.

A second blade 14 narrower than the first blade 12 is then inserted into the penetration groove 13 to cut and divide the master substrate 15, as shown in FIG. 22 (c). Thus, a plurality of crystal oscillators is simultaneously manufactured, as shown in FIG. 22 (d).

Used as the second blade 14 is a disk-shaped resin blade obtained by coupling a diamond abrasive coating or the like using resin such as epoxy resin as a binder. Various types of metals may be used as an additive. The second blade may cut the master substrate 15 made of ceramics while wearing away the master substrate 15 by making the hardness thereof relatively low.

A crystal oscillator is manufactured in the foregoing steps.

The insulating base 10 and the cover member 8 need not be previously divided into pieces prior to assembling of the crystal oscillator. Therefore, the insulating base 10 and the cover member 8 can be simultaneously cut by together dividing them.

Moreover, in this case, the master substrate itself can function as a carrier in assembling the crystal oscillator. Therefore, the necessity of complicated work for holding each of the pieces obtained by dividing the master substrate 15 in the carrier or mounting the cover member 8 on each of the pieces is fully eliminated.

Consequently, the assembling steps of the crystal oscillator are significantly simplified, thereby making it possible to improve the production of the crystal oscillator.

Furthermore, a composite material constructed by joining two types of members, i.e., a substrate made of ceramics and a cover made of a metal can be cut using two types of blades suited to cut of their respective materials. Therefore, the creation of stress in the composite material by the cutting can be effectively restrained, and the substrate and the cover are not stripped so that the resonance frequency can be kept constant with the airtight sealing properties of the crystal oscillation element 5 maintained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an electronic device, comprising:
   providing a master substrate comprising a plurality of substrate areas;
   providing a plurality of piezoelectric oscillation elements, each of which is arranged in each of the substrate areas of the master substrate;
   providing a main cover which is apart and independent from the master substrate;
   joining the main cover and the master substrate in such a manner that each of the piezoelectric oscillation elements is sealed between the main cover and the master substrate; and
   separating the master substrate and the main cover that are joined to each other along a boundary portion between the substrate areas to obtain a plurality of electronic devices,
   wherein each of the substrate areas of the master substrate comprises a recess serving as a sealed space of the piezoelectric oscillation element,
   wherein the main cover and the master substrate are joined with a joining material,
   wherein in a state before separating the master substrate and the main cover, the master substrate further comprises a separated area to be separated between substrate areas adjacent to each other, and
   a space in the separated area comprises a non-joining portion space where the master substrate and the main cover are not joined to each other, and
   wherein a height of the non-joining portion space is smaller than a depth of the recess.

2. The method according to claim 1, wherein the master substrate further comprises a frame serving as a peripheral edge of the recess.

3. The method according to claim 2, wherein the frames in the adjacent substrate areas are connected to each other between the adjacent substrate areas.

4. The method according to claim 2, wherein the master substrate and the frame comprise ceramics.

5. The method according to claim 2, wherein the frame comprises a seal ring including a metal.

6. The method according to claim 1, wherein a space between the main cover and each of the oscillation elements is formed.

7. The method according to claim 1, wherein the main cover is electrically connected to a ground terminal of the master substrate.

* * * * *